United States Patent
Nguyen et al.

(10) Patent No.: US 12,183,605 B2
(45) Date of Patent: Dec. 31, 2024

(54) IN-SITU SEMICONDUCTOR PROCESSING CHAMBER TEMPERATURE APPARATUS

(71) Applicant: Applied Materials, Inc., Santa Clara, CA (US)

(72) Inventors: Andrew Nguyen, San Jose, CA (US); Yogananda Sarode, Bangalore (IN); Xue Chang, San Jose, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 358 days.

(21) Appl. No.: 17/477,750

(22) Filed: Sep. 17, 2021

(65) Prior Publication Data

US 2022/0076972 A1  Mar. 10, 2022

Related U.S. Application Data

(63) Continuation of application No. 15/964,296, filed on Apr. 27, 2018, now abandoned.
(Continued)

(51) Int. Cl.
*H01L 21/67* (2006.01)
*H01J 37/32* (2006.01)
(Continued)

(52) U.S. Cl.
CPC .... *H01L 21/67248* (2013.01); *H01J 37/3244* (2013.01); *H01J 37/32522* (2013.01);
(Continued)

(58) Field of Classification Search
CPC .... H01L 21/67248; H01L 35/30; H01J 37/00; H01J 37/32522; H01J 37/3244; C23C 16/45565; C23C 16/4557; C23C 16/45572
See application file for complete search history.

(56) References Cited

U.S. PATENT DOCUMENTS 3,351,498 A   11/1967  Shinn
3,400,452 A    9/1968  Emley
(Continued)

FOREIGN PATENT DOCUMENTS

CN   1830072 A    9/2006
CN   101374973 A  2/2009
(Continued)

OTHER PUBLICATIONS

Korean Office Action dated Aug. 23, 2022 for Application No. 10-2019-7028547.
(Continued)

*Primary Examiner* — Jeffrie R Lund
(74) *Attorney, Agent, or Firm* — Patterson + Sheridan, LLP

(57) ABSTRACT

Methods and systems for in-situ temperature control are provided. The method includes delivering a temperature-sensing disc into a processing region of a processing chamber without breaking vacuum. The temperature-sensing disc includes one or more cameras configured to perform IR-based imaging. The method further includes measuring a temperature of at least one region of at least one chamber surface in the processing region of the processing chamber by imaging the at least one surface using the temperature-sensing disc. The method further includes comparing the measured temperature to a desired temperature to determine a temperature difference. The method further includes adjusting a temperature of the at least one chamber surface to compensate for the temperature difference.

17 Claims, 9 Drawing Sheets

Related U.S. Application Data

(60) Provisional application No. 62/521,879, filed on Jun. 19, 2017.

(51) Int. Cl.
  *H10N 10/13* (2023.01)
  *C23C 16/455* (2006.01)

(52) U.S. Cl.
  CPC ......... *H10N 10/13* (2023.02); *C23C 16/4557* (2013.01); *C23C 16/45572* (2013.01)

(56) References Cited

U.S. PATENT DOCUMENTS

| | | |
|---|---|---|
| 5,550,373 A | 8/1996 | Cole et al. |
| 5,701,008 A | 12/1997 | Ray et al. |
| 5,793,522 A | 8/1998 | Brun |
| 5,855,677 A | 1/1999 | Carlson et al. |
| 6,100,506 A | 8/2000 | Colelli, Jr. et al. |
| 6,549,277 B1 | 4/2003 | Narushima et al. |
| 6,827,815 B2 | 12/2004 | Hytros et al. |
| 7,645,341 B2 | 1/2010 | Kennedy et al. |
| 8,623,173 B2 | 1/2014 | Son |
| 8,901,518 B2 | 12/2014 | Ranish et al. |
| 9,004,006 B2 | 4/2015 | Kao et al. |
| 9,018,723 B2 | 4/2015 | Le Neel et al. |
| 9,245,768 B2 | 1/2016 | Aderhold |
| 9,357,207 B2 | 5/2016 | Park et al. |
| 2002/0150519 A1 | 10/2002 | Barnes et al. |
| 2002/0162339 A1 | 11/2002 | Harrison et al. |
| 2005/0133160 A1 | 6/2005 | Kennedy et al. |
| 2005/0173569 A1 | 8/2005 | Noorbakhsh et al. |
| 2005/0267606 A1 | 12/2005 | Bartlett et al. |
| 2006/0114012 A1 | 6/2006 | Reitinger |
| 2006/0118160 A1 | 6/2006 | Funahashi et al. |
| 2007/0107523 A1 | 5/2007 | Galewski |
| 2007/0275486 A1 | 11/2007 | Hiroki |
| 2008/0279250 A1 | 11/2008 | Kamei |
| 2009/0165835 A1 | 7/2009 | Chu |
| 2009/0277490 A1 | 11/2009 | Chu |
| 2012/0074126 A1 | 3/2012 | Bang et al. |
| 2012/0074514 A1 | 3/2012 | Nguyen et al. |
| 2012/0118346 A1 | 5/2012 | Liu et al. |
| 2013/0049040 A1 | 2/2013 | Ramer et al. |
| 2013/0154479 A1 | 6/2013 | Kiehlbauch |
| 2013/0174577 A1 | 7/2013 | Brija et al. |
| 2013/0174578 A1 | 7/2013 | Brija |
| 2014/0027092 A1 | 1/2014 | Ranish et al. |
| 2014/0090817 A1 | 4/2014 | Catton et al. |
| 2014/0154888 A1 | 6/2014 | Stevenson et al. |
| 2014/0192840 A1 | 7/2014 | Sun et al. |
| 2014/0209027 A1 | 7/2014 | Lubomirsky et al. |
| 2014/0356985 A1 | 12/2014 | Ricci et al. |
| 2015/0128614 A1 | 5/2015 | Ghoshal et al. |
| 2015/0364388 A1 | 12/2015 | Waldmann et al. |
| 2016/0047691 A1 | 2/2016 | Carlson et al. |
| 2016/0291256 A1 | 10/2016 | Rollinger |
| 2016/0324338 A1 | 11/2016 | Brija |
| 2016/0353610 A1 | 12/2016 | Chan |
| 2017/0125658 A1 | 5/2017 | Funahashi |
| 2017/0148654 A1 | 5/2017 | Paul et al. |
| 2017/0365495 A1 | 12/2017 | Sun et al. |
| 2018/0313697 A1 | 11/2018 | Montes et al. |
| 2018/0366354 A1 | 12/2018 | Nguyen et al. |
| 2019/0346326 A1 | 11/2019 | Kim et al. |
| 2020/0152494 A1 | 5/2020 | Schuda et al. |
| 2022/0076972 A1* | 3/2022 | Nguyen ............ H01L 21/67248 |

FOREIGN PATENT DOCUMENTS

| | | | |
|---|---|---|---|
| CN | 101935750 A | | 1/2011 |
| CN | 102747324 A | * | 10/2012 ............ C01B 31/02 |
| CN | 203233503 U | | 10/2013 |
| CN | 106769163 A | | 5/2017 |
| CN | 113745082 B | * | 10/2023 |
| DE | 4039007 A1 | | 6/1991 |
| JP | 2000508119 A | | 6/2000 |
| JP | 2002050583 A | | 2/2002 |
| JP | 2005188970 A | | 7/2005 |
| JP | 2005228972 A | | 8/2005 |
| JP | 200992676 A | | 4/2009 |
| JP | 2009231562 A | | 10/2009 |
| JP | 2009278345 A | | 11/2009 |
| JP | 2010135450 A | | 6/2010 |
| JP | 2014139989 A | | 7/2014 |
| JP | 2014185898 A | | 10/2014 |
| JP | 2015135984 A | | 7/2015 |
| KR | 100901892 B1 | | 6/2009 |
| WO | 2005024928 A1 | | 3/2005 |
| WO | 2015045602 A1 | | 4/2015 |

OTHER PUBLICATIONS

Japanese Office Action dated Apr. 19, 2022 for Application No. 2019/555973.
Office Action from CN Patent Application No. 201880014818.5 dated Aug. 9, 2023.
Japanese Office Action Dated Dec. 21, 2023 for Application No. 2022-189819.
Korean Office Action dated Oct. 23, 2023 for Application No. 10-2023-7007218.
Office Action from Chinese Patent Application No. 201880014818.5 dated Mar. 16, 2023.
Office Action from Chinese Patent Application No. 201880014818.5 dated Oct. 20, 2023.
International Search Report dated Aug. 17, 2018 for Application No. PCT/US2018/030726.
Taiwan Office Action dated Sep. 11, 2021 for Application No. 107118109.
English translation of JP 2005-228972, 2005.
Taiwan Office Action dated Apr. 23, 2024 for Application No. 112104085.
Japanese Office Action dated Jun. 10, 2024 for Application No. 2022-189819.
Taiwan Office Action for Application No. 112104085 dated Oct. 16, 2024.

* cited by examiner

IN-SITU SEMICONDUCTOR PROCESSING CHAMBER TEMPERATURE APPARATUS

CROSS-REFERENCE TO RELATED APPLICATIONS

This application is a continuation of U.S. patent application Ser. No. 15/964,296, filed Apr. 27, 2018, which claims benefit of U.S. Provisional Patent Application Ser. No. 62/521,879, filed Jun. 19, 2017, all of which are incorporated herein by reference in their entirety.

BACKGROUND

Field

Implementations described herein generally relate to semiconductor processing, and more specifically, to apparatuses and methods for in-situ temperature measurement for the inside of a semiconductor processing chamber.

Description of the Related Art

Semiconductor devices are commonly fabricated by a series of processes in which layers are deposited on a surface of a substrate and the deposited material is etched into desired patterns. As semiconductor device geometries decrease, precise process control during these processes becomes more and more important.

Temperature control is particularly important to achieve repeatable semiconductor manufacture with improved yield and high throughput in chambers, such as etch chambers, for semiconductor processing. Precise manufacturing techniques have small process windows, and even slight variations out of acceptable process control tolerances can lead to catastrophic amounts of production defects. For example, when the temperature of the showerhead assembly, the chuck surface, or chamber sidewalls is too low, there is an increased risk of polymer deposition on these cold spots, which can undesirably alter etch sidewall profiles. When, for example, the temperature of the showerhead assembly is too high, there is an increased risk of films on the faceplate of the showerhead assembly cracking and flaking off, which may cause defects on the substrate. Furthermore, temperature drift of chamber processing surfaces including the gas distribution assembly, chamber sidewalls and chuck surface will also undesirably cause processing results to vary from substrate to substrate.

Therefore, there is a need for an improved method and apparatus for monitoring the temperature of chamber surfaces and internal chamber components in a semiconductor-processing chamber.

SUMMARY

Implementations described herein generally relate to semiconductor processing, and more specifically, to apparatuses and methods for in-situ temperature measurement for the inside of a semiconductor processing chamber. In one implementation, a showerhead assembly is provided. The showerhead assembly comprises a first electrode having a plurality of openings therethrough and a gas distribution faceplate attached to a first lower major surface of the electrode. The gas distribution plate includes a plurality of through-holes for delivering process gases to a processing chamber. The gas distribution plate is divided into a plurality of temperature-control regions. The showerhead assembly further comprises a chill plate positioned above the electrode for providing temperature control and a plurality of heat control devices to manage heat transfer within the showerhead assembly. The heat control device comprises a thermoelectric module and a heat pipe assembly coupled with the thermoelectric module. Each of the plurality of heat control devices is associated with a temperature control region and provides independent temperature control to its associated temperature control region.

In another implementation, a temperature-sensing disc is provided. The temperature-sensing disc comprises a disc-shaped body. The disc-shaped body has a diameter of 300 millimeters, a front surface, and a back surface opposing the front surface. The temperature-sensing disc comprises further comprises one or more cameras positioned on at least one of the front surface and the back surface, wherein the one or more cameras are configured to perform IR-based imaging.

In yet another implementation, a processing chamber is provided. The processing chamber comprises a chamber body having a top wall, sidewall, and bottom wall defining a processing volume. The processing chamber further comprises a substrate support assembly positioned in the processing volume and a showerhead assembly positioned opposite the substrate support. The showerhead assembly comprises a first electrode having a plurality of openings therethrough, a gas distribution faceplate attached to a first lower major surface of the electrode. The gas distribution plate includes a plurality of through-holes for delivering process gases to a processing chamber. The gas distribution plate is divided into a plurality of temperature-control regions. The showerhead assembly further comprises a chill plate positioned above the metal electrode for providing temperature control and a plurality of heat control devices to manage heat transfer within the showerhead assembly. The plurality of heat control devices each comprise a thermoelectric module and a heat pipe assembly coupled with the thermoelectric module, wherein each of the plurality of heat control devices is associated with a temperature control region and provides independent temperature control to its associated temperature control region.

In yet another implementation, a substrate support assembly is provided. The substrate support assembly comprises an upper surface for supporting a substrate, wherein the upper surface is divided into a plurality of temperature-control regions and a plurality of heat control devices to manage heat transfer within the substrate support assembly. Each heat control device comprises a thermoelectric module and a heat pipe assembly coupled with the thermoelectric module. Each of the plurality of heat control devices is associated with a temperature control region and provides independent temperature control to its associated temperature control region.

In yet another implementation, a method is provided. The method comprises delivering a temperature-sensing disc into a processing region of a processing chamber without breaking vacuum. The temperature-sensing disc includes one or more cameras configured to perform IR-based imaging. The method further comprises measuring a temperature of at least one region of at least one chamber surface in the processing region of the processing chamber by imaging the at least one surface using the temperature-sensing disc. The method further comprises comparing the measured temperature to a desired temperature to determine a temperature difference. The method further comprises adjusting a temperature of the at least one chamber surface to compensate for the temperature difference.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
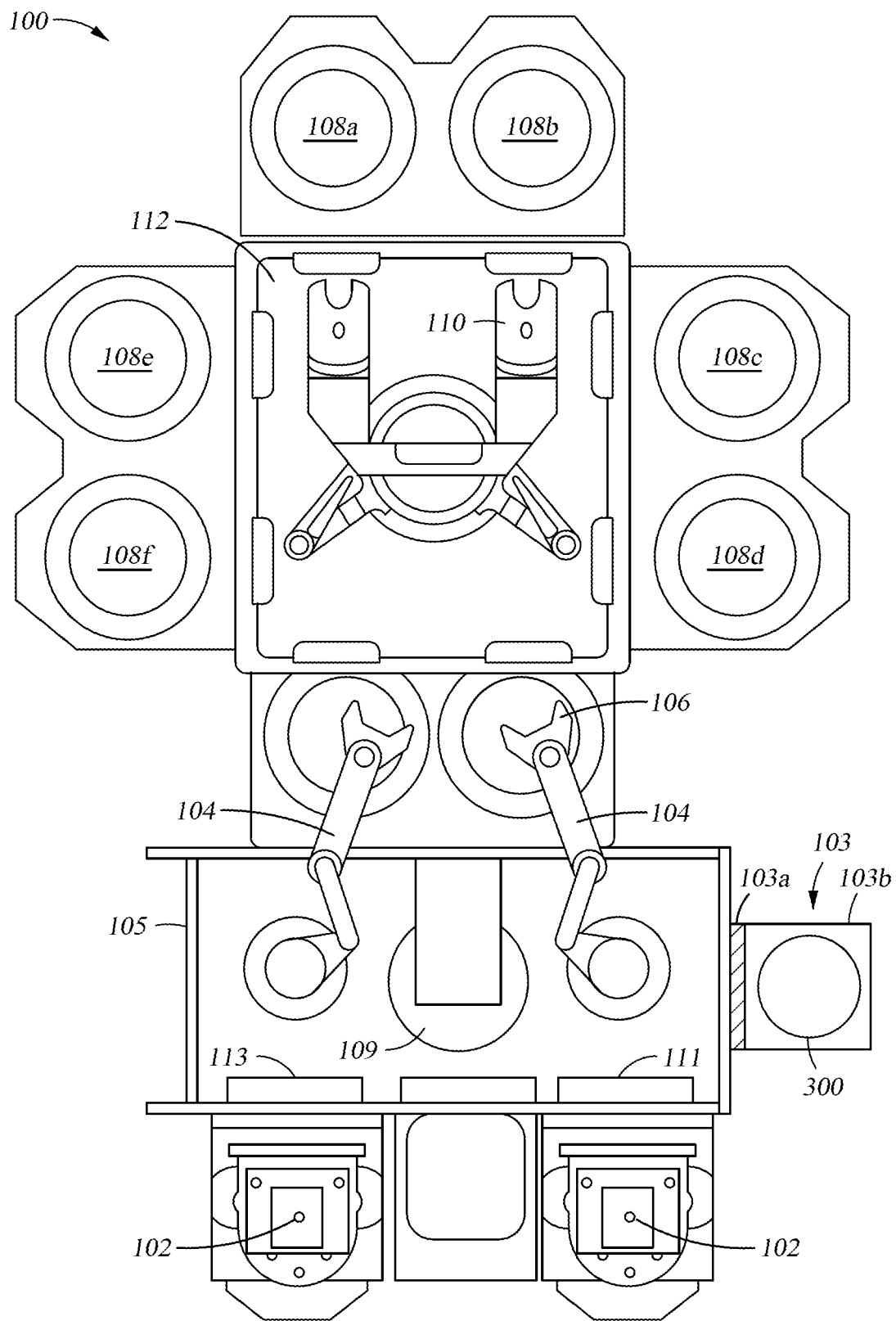
FIG. 1 is a plan view of an example of a processing system in accordance with one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes techniques and apparatus for temperature control and substrate processing chambers. Certain details are set forth in the following description and in FIGS. 1-8 to provide a thorough understanding of various implementations of the disclosure. Other details describing well-known structures and systems often associated with etch processes, deposition processes, and temperature control, are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a temperature control process that can be carried out using any suitable thin film deposition or etch system. Examples of suitable systems include the CENTURA® systems, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. Other tools capable of performing in-situ temperature control processes may also be adapted to benefit from the implementations described herein. In addition, any system enabling the in-situ temperature control processes described herein can be used to advantage. The apparatus description described herein is illustrative and should not be construed or interpreted as limiting the scope of the implementations described herein.

Some implementations of the present disclosure generally relate to semiconductor plasma etch chamber technology and hardware control systems for addressing the issue of non-uniformity of heating or cooling showerhead chamber surfaces (e.g., top electrode, bottom electrode, and chamber sidewall) in the etch process chamber.

As technology nodes advance and feature sizes are reduced, precise control of RF, gas flow and thermal control will help to achieve on wafer uniformity with device performance and improved yield for semiconductor processing with lower cost per wafer. Based on the chemistry used for etching and process application requirements, uniform steady heating or cooling across chamber surfaces (e.g., showerhead assembly, electrostatic chuck, and chamber walls) is paramount to achieve repeatable process results. Since plasma etching creates heat on the exposed surface of the showerhead assembly, controlling the temperature of the showerhead assembly and other chamber surfaces is critical to avoid hot or cold spots on the surface. These hot and cold spots can lead to polymer adhesion on the cold spots, which cause slower etch rates and profile control issues. This problem is exacerbated when etching higher aspect ratio features and other 1× nm node critical applications.

Semiconductor plasma processing hardware typically includes a high vacuum chamber with a pumping system. Often, top source/electrode with showerhead and gas distribution is used depending on the application and film being processed and silicon wafers are etched while being electrostatically clamped to an electrostatic chuck inside the vacuum chamber during plasma processing. To maintain process uniformity and critical dimension ("CD") variation within a certain range, electrical (AC/DC/RF) control, gas flow control and thermal uniformity are critical. Some implementations of the present disclosure provide methods and apparatus for maintaining zone enabled heating and cooling of a showerhead assembly and other chamber surfaces, which include a closed loop control system used for in-situ tuning temperature.

In some implementations of the present disclosure, an IR camera embedded on a wafer-sized disc (vacuum compatible material) is used to monitor the temperature of one or more surfaces within the processing chamber. In some implementations, cameras (e.g., nano-cameras), which are embedded on at least one of the top surface and the bottom surface of the disc, enable IR-based imaging of the top electrode (e.g., the showerhead assembly) and the bottom electrode (e.g., the electrostatic chuck), and the chamber wall without venting the process chamber. Further, the disc can move from a stored location in a FOUP to a transfer chamber and finally to the process chamber without venting the process chamber. In addition, an existing platform robot may be used to transfer the disc inside the process chamber. When inside the process chamber, existing wafer lift pins may be used to position the disc to image both the top and bottom electrodes. The image data can be transferred wirelessly to an external device and control system to create a temperature profile map of the electrode and chamber surfaces. Depending on the location of hot or cold spots as indicated by the temperature map, the temperature of the electrode and chamber surfaces can be tuned (increased or decreased) at the pixel level to create a more uniform temperature profile.

In some implementations of the present disclosure, an improved showerhead assembly design is provided. Traditional showerhead assembly designs include a standard chill plate where the entire area of the chill plate is either heated or cooled. In some implementations of the present disclosure, a showerhead assembly in which temperature can be controlled via multiple zones or pixels is provided. Typical showerhead designs include a gas distribution plate, which is typically ceramic, bonded to an aluminum base to increase life and yield. In some implementations of the present disclosure, heat pipes are used as part of a heat-transfer device that combines the principles of both thermal conductivity and phase transition to efficiently manage the transfer of heat between two solid interfaces (e.g., the top and bottom aluminum plates). Some implementations of the present disclosure also include a showerhead assembly with a top and bottom aluminum-base connected with a series of heat pipes. The heat pipes may be positioned in pre-defined pattern of pixels.

In some implementations of the present disclosure, each pixel element or region of the showerhead assembly is also connected to a thermoelectric element (e.g., p-type and n-type elements). Each thermoelectric element is coupled with a heat pipe to form a heat control device. Each heat control device is coupled with a pixel or region to independently control the temperature of that pixel or region. The thermoelectric elements are configured to be electrically connected in series but thermally connected in parallel to ensure maximum power generation output, which is reversible so that both module types can act as a cooler or a generator; if a voltage is applied to a module, it will pump heat. Some implementations of the present disclosure also include a standard chill plate, which is used as a heat exchanger to globally heat and cool the temperature of the showerhead assembly rapidly. In some implementations, the temperature tuning of the showerhead assembly to remove hot or cold spots is achieved using the IR-based imaging data and wireless data exchange with external control system and pixel control for temperature tuning.

FIG. 1 is a plan view of an example of a processing system 100 in accordance with one or more implementations of the present disclosure. FIG. 1 depicts the possible movement of a temperature-sensing disc 300 through the processing system 100. The processing system 100 generally includes a factory interface 105, a side storage pod 103 for storing the temperature-sensing disc 300, a transfer chamber 112, an atmospheric holding station 109, and a plurality of twin processing chambers 108a-108b, 108c-108d and 108e-108f. The factory interface 105 is operating at atmospheric pressure for storing and holding substrates. The factory interface 105 includes at least one atmospheric robot 104, such as a dual-blade atmospheric robot, and is configured to receive one or more cassettes of substrates.

On a first side of the factory interface 105, one or more load ports may be provided. In one implementation, three load ports are provided. For clarity, only two load ports 111, 113 are depicted in the implementation of FIG. 1. The load port 111, 113 is adapted to receive from a front opening unified pod ("FOUP") 102 a substrate (e.g., 300 mm diameter wafers) which is to be processed. The FOUP(s) 102 has one or more substrate carriers configured to temporarily and portably store the substrates. A load lock chamber 106 is coupled to a second side (opposing to the first side) of the factory interface 105. The load lock chamber 106 is coupled to the transfer chamber 112 in which the plurality of twin processing chambers 108a-108b, 108c-108d and 108e-108f are located.

The substrate is transferred by the atmospheric robot 104 from the FOUP(s) 102 to the load lock chamber 106. A second robotic arm 110 is disposed in the transfer chamber 112 coupled to the load lock chamber 106 to transport the substrates from the load lock chamber 106 to processing chambers 108a-108f coupled to the transfer chamber 112. The factory interface 105 therefore provides a transition between the atmospheric environment of the factory interface and the vacuum environment of the tool or processing chambers.

The processing chambers 108a-108f may be any type of processing chambers, for example, chemical vapor deposition (CVD) chambers, atomic layer deposition (ALD) chambers, physical vapor deposition (PVD) chambers, ion metal implant (IMP) chambers, plasma etching chambers, annealing chambers, other furnace chambers, etc. In one implementation, the processing chambers 108a-108f are configured for depositing, annealing, curing and/or etching a film on a substrate. In one configuration, three pairs of the processing chambers (e.g., 108a-108b, 108c-108d and 108e-108f) may be used to deposit the film on the substrate. If desired, any of these processing chambers 108a-108b, 108c-108d and 108e-108f, or one or more additional processing chambers may be coupled to the transfer chamber 112 and arranged to perform other conventional semiconductor device fabrication process such as oxidation, film deposition, etching, heating, degassing, ashing, ion implanting, metrology, etc. upon application.

The side storage pod 103 may include a chamber body 103B for holding the temperature-sensing disc 300 and a slit valve 103A. The slit valve 103A is used to seal-off an internal region of the chamber body 103b after the temperature-sensing disc 300 has been positioned therein by the atmospheric robot 104.

The temperature-sensing disc 300 is transferred by the atmospheric robot 104 from the side storage pod 103 to the load lock chamber 106. A second robotic arm 110 is disposed in the transfer chamber 112 coupled to the load lock chamber 106 to transport the temperature-sensing disc 300 from the load lock chamber 106 to processing chambers 108a-108f where temperature monitoring is performed.

In some implementations, the temperature-sensing disc 300 is positioned in the FOUP(s) 102. The temperature-sensing disc 300 is transferred by the atmospheric robot 104 from the FOUP(s) 102 to the load lock chamber 106. A second robotic arm 110 is disposed in the transfer chamber 112 coupled to the load lock chamber 106 to transport the temperature-sensing disc 300 from the load lock chamber 106 to processing chambers 108a-108f coupled to the transfer chamber 112.

Figure 2:
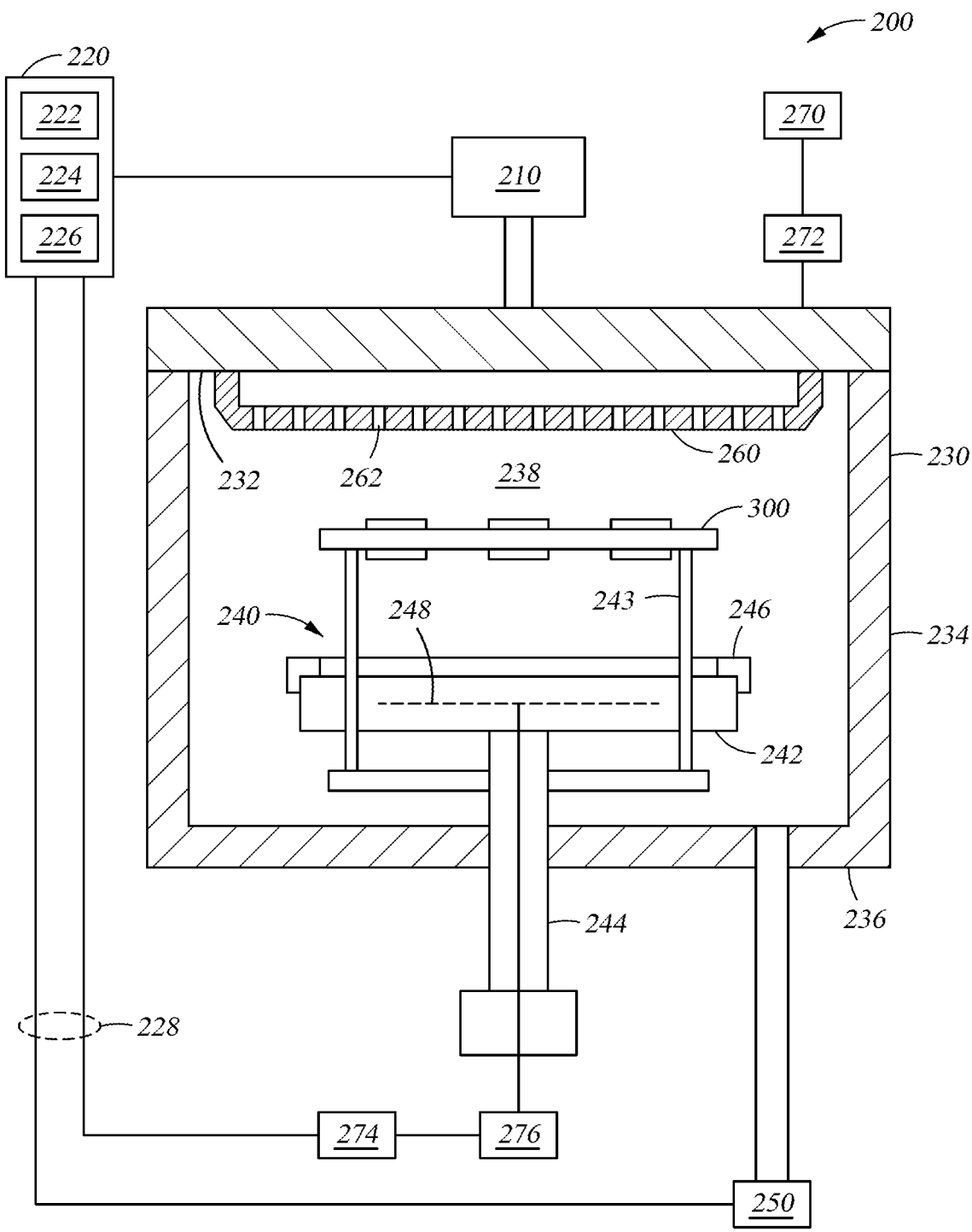
FIG. 2 is a cross-sectional view of an example of a processing chamber in accordance with one or more implementations of the present disclosure.

FIG. 2 is a cross-sectional view of an example of processing chamber 200 having the temperature-sensing disc 300 disposed therein in accordance with one or more implementations of the present disclosure. The processing chamber 200 may be any of the processing chambers 108a-f of processing system 100. The processing chamber 200 is coupled with a gas panel 210 and a control system 220. The processing chamber 200 generally includes a chamber body 230 having a top wall 232, a sidewall 234 and a bottom wall 236. The top wall 232, the sidewall 234 and the bottom wall 236 define a processing volume 238. A substrate support assembly 240 is provided in the processing volume 238 of the processing chamber 200. The substrate support assembly 240 generally includes an electrostatic chuck 242 supported by a stem 244. The electrostatic chuck 242 may be fabricated from aluminum, ceramic, and other suitable materials. The electrostatic chuck 242 may be moved in a vertical direction inside the processing chamber 200 using a displacement mechanism (not shown).

The electrostatic chuck 242 has an upper surface 246 for supporting a substrate. Lift pins 243 are moveably disposed through the substrate support assembly 240 and are adapted to space the substrate (if present) or the temperature-sensing disc 300 from the upper surface 246. The temperature-sensing disc 300 is positioned a suitable distance from the surface(s) to be monitored (e.g., any one of the upper surface 246 of the electrostatic chuck 242, the surfaces of the showerhead assembly 260, the surfaces of the sidewall, the surfaces of the top wall 232, and the surfaces of the bottom wall.) In one implementation, as depicted in FIG. 2, the temperature-sensing disc 300 is positioned in the processing volume 238 using the lift pins 243 such that the temperature-sensing disc 300 can monitor multiple surfaces.

The electrostatic chuck 242 includes a chucking electrode 248, which may be a mesh of a conductive material. The chucking electrode 248 may be embedded in the electrostatic chuck 242. The chucking electrode 248 is coupled with a power source 274 that, when energized, electrostatically clamps a substrate to the upper surface 246 of the electrostatic chuck 242. The power source 274 may be coupled with the chucking electrode 248 via a matching network 276.

A showerhead assembly 260 having a plurality of apertures 262 is disposed on the top of the processing chamber 200 above the electrostatic chuck 242. The apertures 262 of the showerhead assembly 260 are utilized to introduce process gases into the processing chamber 200. The apertures 262 may have different sizes, number, distributions, shape, design, and diameters to facilitate the flow of the various process gases for different process requirements. The showerhead assembly 260 is connected to the gas panel 210 that allows various gases to supply to the processing volume 238 during processing. A plasma is formed from the process gas mixture exiting the showerhead assembly 260 to enhance thermal decomposition of the process gases resulting in etching or deposition of material on a surface of a substrate not shown.

The showerhead assembly 260 and the electrostatic chuck 242 may form a pair of spaced apart electrodes in the processing volume 238. One or more RF power source(s) 270 provide a bias potential through an optional matching network 272 to the showerhead assembly 260 to facilitate generation of plasma between the showerhead assembly 260 and the electrostatic chuck 242. Alternatively, the RF power source 270 and matching network 272 may be coupled to the showerhead assembly 260, electrostatic chuck 242, or coupled to both the showerhead assembly 260 and the electrostatic chuck 242, or coupled to an antenna (not shown) disposed exterior to the processing chamber 200.

A vacuum pump 250 is coupled to a port formed in the bottom wall 236 of the processing chamber 200. The vacuum pump 250 is used to maintain a desired gas pressure in the processing chamber 200. The vacuum pump 250 also evacuates post-processing gases and by-products of the process from the processing chamber 200.

The processing chamber 200 may further include additional equipment for controlling the chamber pressure, for example, valves (e.g., throttle valves and isolation valves) positioned between the chamber body 230 and the vacuum pump 250 to control the chamber pressure.

The control system 220 includes a central processing unit (CPU) 222, a memory 226, and a support circuit 224 utilized to control the process sequence and regulate the gas flows from the gas panel 210. The CPU 222 may be of any form of a general-purpose computer processor that may be used in an industrial setting. The software routines can be stored in the memory 226, such as random access memory, read only memory, floppy, or hard disk drive, or other form of digital storage. The support circuit 224 is conventionally coupled to the CPU 222 and may include cache, clock circuits, input/output systems, power supplies, and the like. Bi-directional communications between the control system 220 and the various components of the processing chamber 200 are handled through numerous signal cables collectively referred to as signal buses 228, some of which are illustrated in FIG. 2.

Figure 3A:
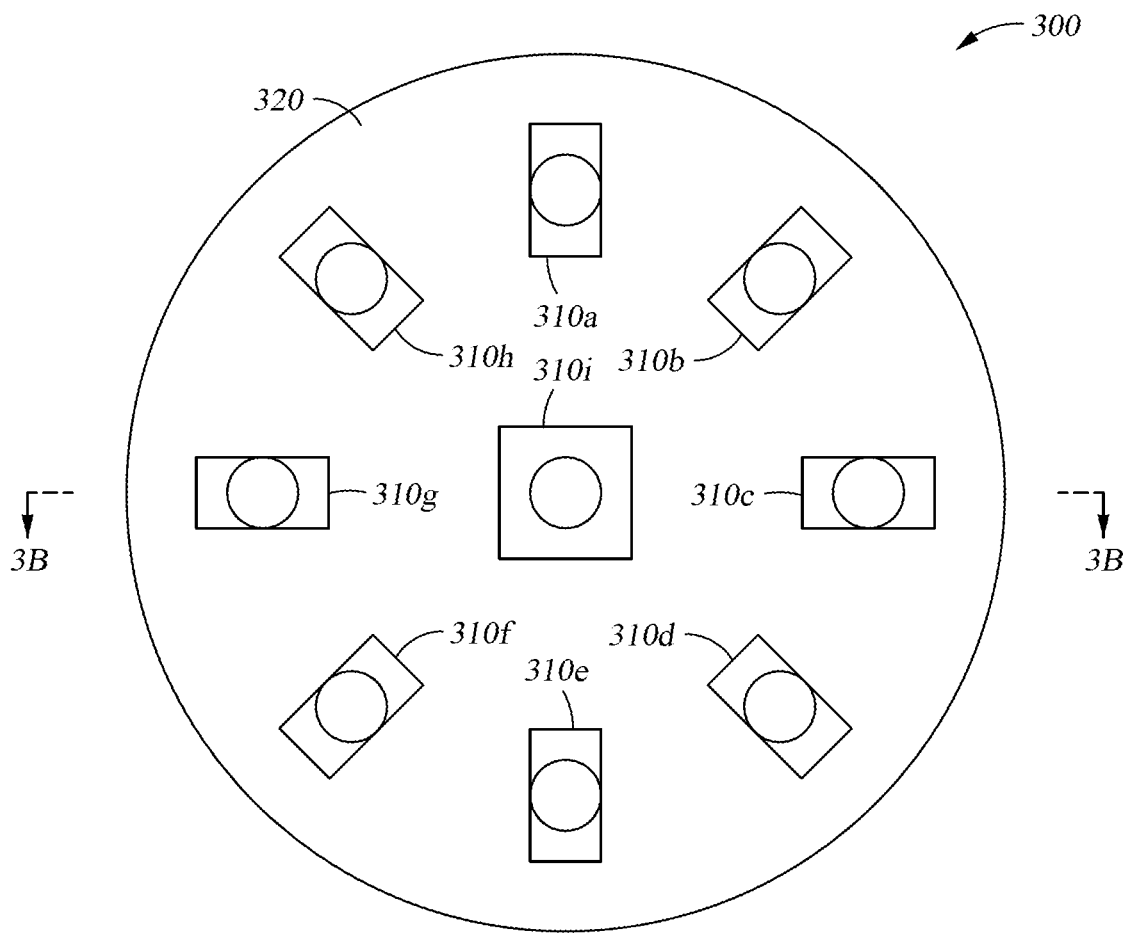
FIG. 3A is a top view of one example of a temperature-sensing disc in accordance with one or more implementations of the present disclosure.
Figure 3B:
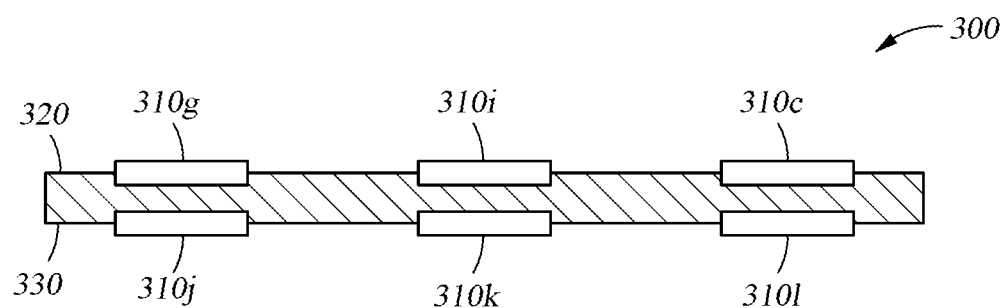
FIG. 3B is a cross-sectional view of the temperature-sensing disc taken along line 3B-3B of FIG. 3A in accordance with one or more implementations of the present disclosure.

FIG. 3A is a top view of one example of the temperature-sensing disc 300 in accordance with one or more implementations of the present disclosure. FIG. 3B is a cross-sectional view of the temperature-sensing disc 300 taken along line 3B-3B of FIG. 3A in accordance with one or more implementations of the present disclosure. In some implementations, the temperature-sensing disc 300 is an IR-based temperature-sensing disc. The temperature-sensing disc 300 is typically sized similarly to the wafers processed by the processing chamber. For example, in some implementations where the processing system is configured to process 300 mm sized wafers, the temperature-sensing disc 300 is sized similarly to a 300 mm wafer sized disc. In some implementations, where the processing system is configured to process 200 mm sized wafers, the temperature-sensing disc 300 is sized similarly to a 200 mm wafer sized disc. Sizing the temperature-sensing disc 300 similarly to the wafers process by the processing chamber allows the temperature-sensing disc 300 to move from its stored location (e.g., either the FOUP or the side storage pod) to the transfer chamber and finally to the processing chamber without venting the processing chamber. The existing platform robots can be used to transfer the temperature-sensing disc 300 into the processing chamber. The temperature-sensing disc 300 may be positioned in the processing chamber using existing lift pins. Although described as a disc, the temperature-sensing disc 300 may have other shapes depending on the process chamber to be monitored.

The temperature-sensing disc 300 may comprises any vacuum compatible material. Suitable materials include dielectric materials and silicon-containing materials. In one implementation, the temperature-sensing disc 300 is composed of a silicon-containing material. In some implementations, the temperature-sensing disc 300 is composed of a dielectric material.

The temperature-sensing disc 300 has one or more cameras 310a-310i (collectively "310") positioned thereon. The one or more cameras 310 are typically configured to perform IR-based imaging of the surfaces within the processing chamber. In one implementation, the cameras 310 are configured to perform infrared imaging of the chamber surfaces and to transmit the infrared images wirelessly from the inside of the processing chamber. The cameras 310 may be attached to the temperature-sensing disc 300 using any suitable attachment methods. In some implementations, the cameras 310 are glued to the surfaces of the temperature-sensing disc 300. In some implementations, the cameras 310 are either partially embedded or fully embedded into the body of the temperature-sensing disc 300. In some implementations, the one or more cameras are nano-cameras.

In some implementations, cameras 310 are positioned on both the front surface 320 and the back surface 330 of the temperature-sensing disc 300. Positioning cameras 310 on both the front surface 320 and the back surface 330 of the temperature-sensing disc 300 allows opposing chamber surfaces to be simultaneously imaged. For example, referring to FIG. 2, the cameras 310 on the front surface 320 can image the surface of the showerhead assembly 260 while the cameras 310 on the back surface 330 can image the upper surface 246 of the electrostatic chuck 242. In some implementations, cameras 310 are positioned on only the front surface 320 or the back surface 330 of the temperature-sensing disc 300. In some implementations, nine or more cameras are positioned on the front surface of the disc-shaped body. In some implementations, nine or more cameras are positioned on the back surface of the disc-shaped body. It should also be understood that any number of cameras may be used depending upon, for example, the number of surfaces to be monitored and the total surface area to be monitored.

Figure 4:
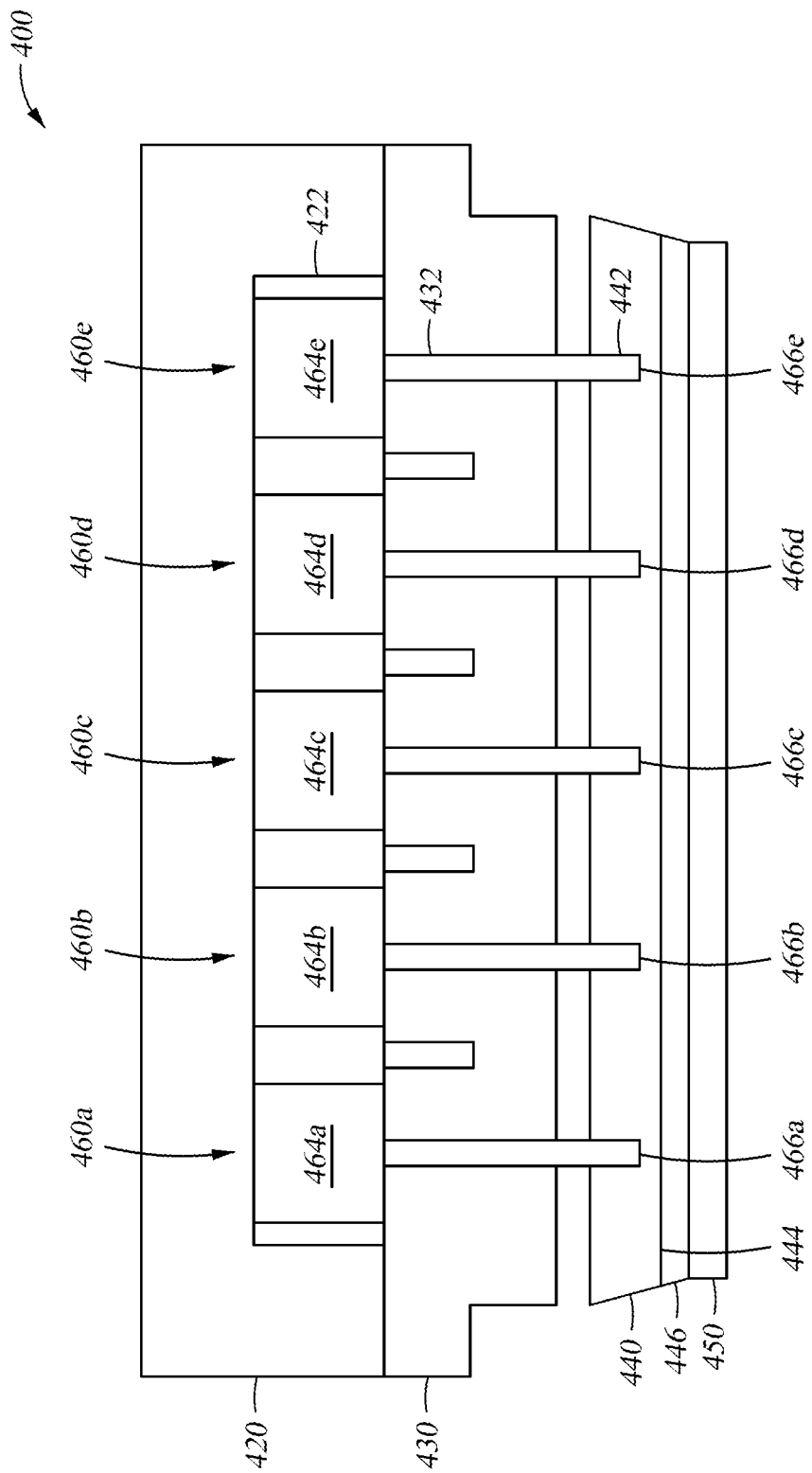
FIG. 4 is a cross-sectional view of a showerhead assembly in accordance with one or more implementations of the present disclosure.

FIG. 4 is a cross-sectional view of a showerhead assembly 400 in accordance with one or more implementations of the present disclosure. In some implementations, the showerhead assembly 400 may be used in place of showerhead assembly 260 in processing chamber 200. The showerhead assembly 400 incorporates one or more heat control devices 460a-460e (collectively 460) to manage heat transfer within the showerhead assembly 400. Each heat control device 460 includes a thermoelectric module 464a-464e (collectively 464) and a heat pipe assembly 466a-466e (collectively 466). In some implementations, each heat control device 460 is associated with a pixel or region as will be discussed in FIGS. 7A-7D. Each heat control device 460 provides independent temperature control to its associated pixel or region.

The showerhead assembly 400 includes a chill plate (lid) 420, a top plate 430, a bottom plate 440, and a gas distribution faceplate 450. The chill plate 420 is positioned on the top plate 430. The chill plate 420 provides temperature control off the showerhead assembly 400. A recess 422 is defined between the chill plate 420 and the top plate 430.

The top plate 430 includes a plurality of through-holes 432. In one implementation, each of the plurality of through-holes 432 accommodates a heat pipe assembly 466 of the heat control device 460. In some implementations, the top plate 430 has a second plurality of through-holes (not shown in this view) for delivering process gases into a processing chamber. The top plate 430 can be made of aluminum, ceramic, Si—Si carbide, or graphite converted to silicon carbide, for example and not by way of limitation. In one implementation, the top plate 430 is a metal plate. In one implementation, the top plate 430 is made of aluminum. In some implementations, the top plate 430 is made of anodized aluminum.

The bottom plate 440 includes a plurality of holes 442. In one implementation, each of the plurality of holes 442 accommodates a portion of the heat pipe assembly 466 of the heat control device 460. In some implementations, the bottom plate 440 has a second plurality of through-holes (not shown in this view) for delivering process gases into the processing chamber. The bottom plate 440 can be made of aluminum, ceramic, Si—Si carbide, or graphite converted to silicon carbide, for example and not by way of limitation. In one implementation, the bottom plate 440 is a metal plate. In one implementation, the bottom plate 440 is made of aluminum. In some implementations, the bottom plate 440 is made of anodized aluminum.

The gas distribution faceplate 450 includes a plurality of through-holes (not shown) for delivering processing gases into the interior of the semiconductor-processing chamber. The through-holes in the gas distribution faceplate 450 can be, for example and without limitation, round or crescent-shaped.

The gas distribution faceplate 450 can be made of silicon carbide, yttrium oxide, anodized aluminum, ceramic, quartz, or silicon, for example and not by way of limitation. In one implementation, the gas distribution faceplate 450 is made of silicon carbide. The gas distribution faceplate 450 may be bonded to a first, lower major surface 444 of the bottom plate 440 by a bonding layer 446. In some implementations, the bonding layer 446 is accomplished using a silicone-based adhesive with different types of fillers tailored for enhancing thermal conductivity. Bonding of gas distribution faceplate 450 to the bottom plate 440 can be accomplished using other materials and/or methods known in the art. However, bonding of the gas distribution faceplate 450 to the bottom plate 440 should be performed using a bonding material, which has enough compliance to prevent delamination due to thermal mismatch between the gas distribution faceplate 450 and the bottom plate 440. Although a bonding layer is shown, it should also be understood that the gas distribution faceplate 450 may be attached to the showerhead assembly using other attachment methods known in the art.

The showerhead assembly 400 further includes the plurality of heat control devices 460a-460e (collectively 460). Each heat control device 460 includes a thermoelectric module 464a-464e (collectively 464) coupled with a heat pipe assembly 466a-466e (collectively 466). Each heat control device 460 is associated with a pixel or region defined on the gas distribution faceplate 450. Each heat control device 460 combines the principles of both thermal conductivity and phase transition to efficiently manage the transfer of heat between the top plate 430 and the bottom plate 440 and the chill plate 420. Each heat control device 460 is associated with a pixel or region as will be described in reference to FIGS. 7A-7D.

Figure 5:
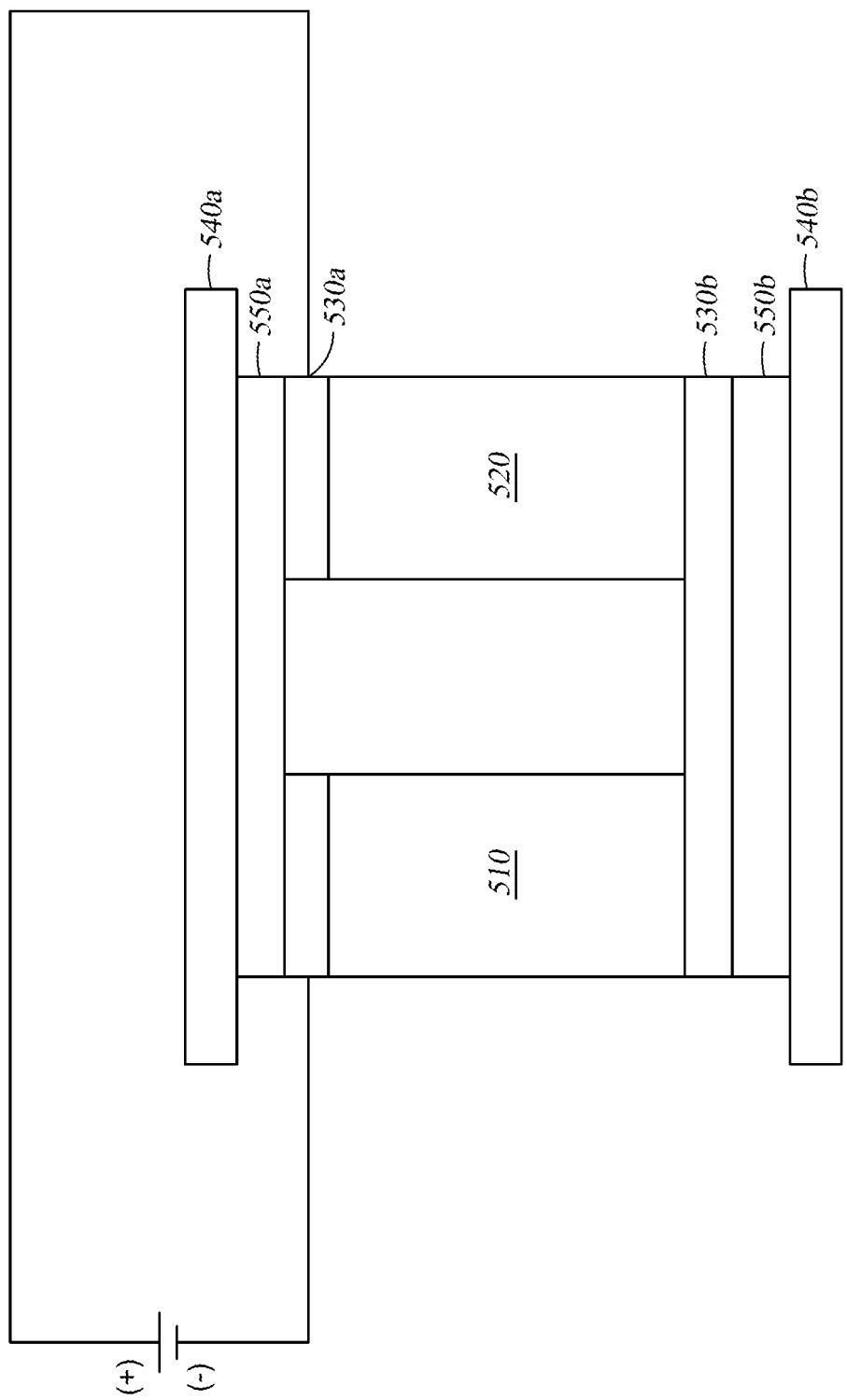
FIG. 5 is a cross-sectional view of a thermoelectric module that may be used with a heat control device in accordance with one or more implementations of the present disclosure.

FIG. 5 is a cross-sectional view of a thermoelectric module that may be used with a showerhead assembly in accordance with one or more implementations of the present disclosure. The thermoelectric module may be thermoelectric module 464 and the showerhead assembly may be showerhead assembly 400. In general, the thermoelectric module 464 is composed of an n-type thermoelectric material 510, a p-type thermoelectric material 520, conductive metal layers 530a and 530b, a top substrate 540a and a bottom substrate 540b. In some implementations, a first insulating layer 550a is positioned between conductive metal layer 530a and top substrate 540a. In some implementations, a second insulating layer 550b is positioned between conductive metal layer 530b and bottom substrate 540b.

The n-type thermoelectric material 510 and the p-type thermoelectric material 520 are lump-shaped, and both of the top substrate 540a and the bottom substrate 540b possess high thermal conductivity. In some implementations, the n-type thermoelectric material 510 and the p-type thermoelectric material 520 are made of a semiconductor or a semi-metal element or compound possessing a high ZT value, such as bismuth telluride ($(BiSb)_2$ $(TeSe)_3$) series, bismuth telluride ($Bi_2Te_3$), lead telluride (PbTe) and tin telluride (PbSnTe) series that are doped with antimony and selenium, or compound series such as silicon (Si) and silicon germanium (SiGe) series, half-Heusler dielectric alloy series (a strong magnetic non-iron alloy), silicide, or tungsten diselenide ($WSe_2$) series. Moreover, the thermoelectric elements can be formed by way of sputtering, thermal evaporation, arc ion plating, chemical vapor evaporation, electroplating and chemical plating. However, in practical application, the choice of materials and the ways of formation are determined according to the actual needs and practical conditions, and the disclosure does not have specific restrictions.

The n-type thermoelectric material 510 and the p-type thermoelectric material 520 are configured to be electrically connected in series but thermally connected in parallel to ensure maximum power generation output. The elements are then sandwiched between two ceramic plates, one side covers the hot joins and the other side covers the cold joins. The effect is reversible so that both module types can act as a cooler or a generator. If a voltage is applied to a module, it will pump heat, but if a temperature difference is applied across a module, a voltage will be produced.

In some implementations, the top substrate 540a and the bottom substrate 540b also possess insulating properties. The functions of the thermoelectric module are mainly determined by the properties of the thermoelectric materials 510 and 520. As indicated in FIG. 5, the n-type thermoelectric material 510 and the p-type thermoelectric material 520 are normally vertically type, and are connected in series via the conductive metal layers 530a and 530b.

In some implementations, the top and bottom substrates 540a and 540b with electrical insulation and high thermal conductivity, for example, are made of ceramic material with high thermal conductivity realized by such as aluminum oxide, aluminum nitride and silicon carbide, or a silicon or metal substrate whose surface is covered with an insulating dielectric layer. However, the disclosure does not have specific restrictions regarding the choice of materials in practical application. In some implementations, the top substrate 540a or heat sink plate functions as a heat sink, which releases heat into, for example, the chill plate 420. In some implementations, the top substrate 540a is positioned adjacent to the chill plate 420. In some implementations, the bottom substrate 540b functions as a cooling plate that absorbs heat from, for example, from the top plate 430 and/or the bottom plate 440. In some implementations, the bottom substrate 540b is positioned adjacent to the top plate 430 and/or the bottom plate 440.

In the application of the thermoelectric cooling module, the inputted direct current flows in the n-type thermoelectric material 510 and the p-type thermoelectric materials 520 in a direction (vertically flow) parallel to that of thermal flow (vertically transferring) of the conversion device, and the thermoelectric cooling module generates temperature difference, and absorbs and dissipates the heat at the bottom and the top, respectively. Take power generation by way of temperature difference for example. The directions of the thermoelectric module temperature difference and thermal flow are still parallel to the flow direction of the current generated in the thermoelectric materials.

Figure 6:
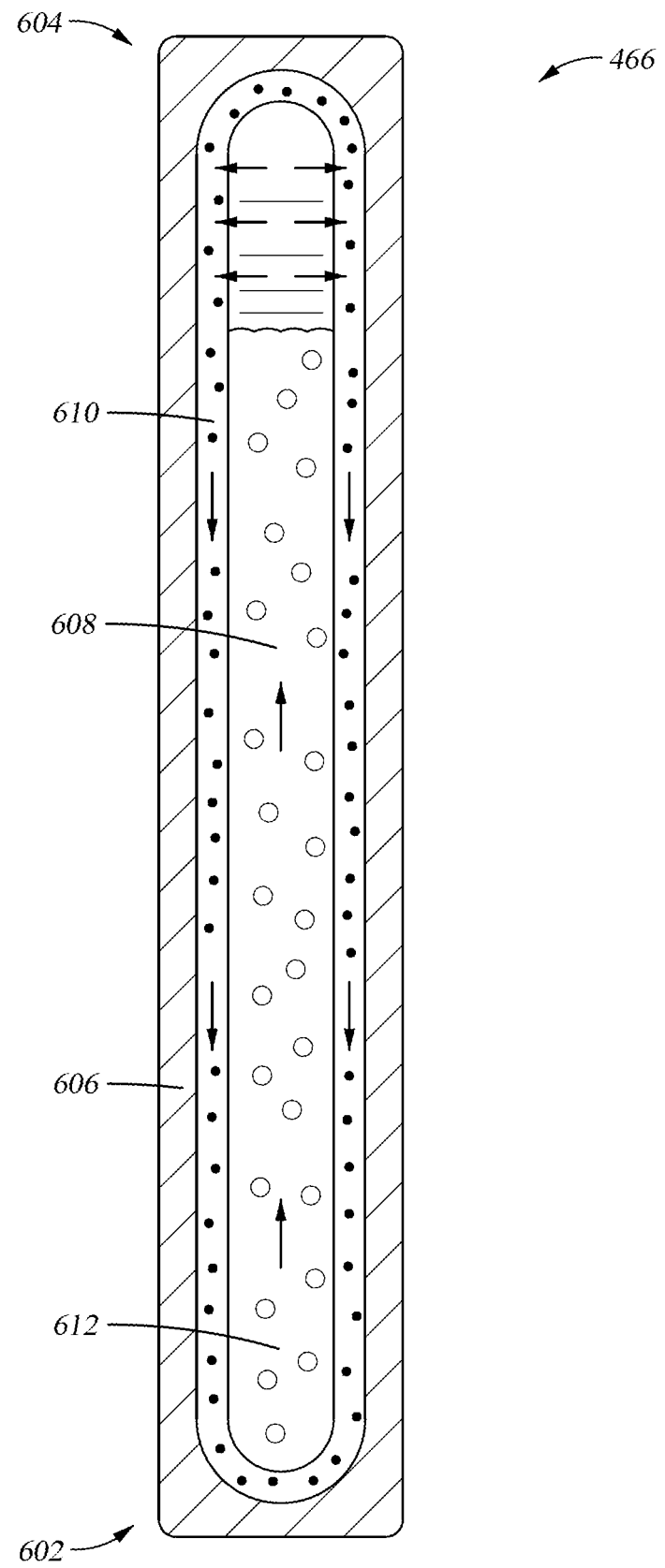
FIG. 6 is a cross-sectional view of a heat pipe assembly that may be used with a heat control device in accordance with one or more implementations of the present disclosure.

FIG. 6 is a cross-sectional view of a heat pipe assembly that may be used with a showerhead assembly in accordance with one or more implementations of the present disclosure. The heat pipe assembly may be heat pipe assembly 466 and the showerhead assembly may be showerhead assembly 400. The heat pipe assembly 466 forms a portion of the heat control device 460 of FIG. 4. As shown in FIG. 4, the heat control devices 460a-460e are composed of a plurality of parallel and independently operating heat pipes.

Each heat pipe assembly 466 includes a casing 606 enclosing a cavity 608. The casing may be formed from a material with high thermal conductivity, such as copper or aluminum. The cavity 608 is vacuumed and filled with a fraction of a percent by volume of a working fluid 612. The working fluid 612 may be water, ethanol, acetone, sodium, or mercury. The working fluid 612 may be chosen according to the operating temperature of the heat pipe assembly 466. Because the partial vacuum state within the cavity, a portion of the working fluid 612 in the cavity 608 is in liquid phase and the remaining portion the working fluid 612 is in gas phase.

The heat pipe assembly 466 may have a hot interface 602 configured to be in thermal contact with a target to be cooled at a first end and a cold interface 604 configured to be in thermal contact with a heat sink an second end opposite to the hot interface 602. Optionally, a wick structure 610 may be lined inside the casing 606 and surrounding the cavity 608. The wick structure 610 is configured to exert a capillary pressure on a liquid surface of the working fluid 612 at the cold interface 604 and wick the working fluid 612 to the hot interface 602.

The heat pipe assembly 466 is a heat exchange device that combines the principle of both thermal conductivity and phase transition to efficiently manage the transfer of heat between the hot interface 602 and the cold interface 604. At the hot interface 602 within a heat pipe, liquid of the working fluid 612 in contact with the casing 606 turns into vapor by absorbing heat from that heat source, that is in thermal contact with the hot interface 602. The vapor condenses back into liquid at the cold interface 604, releasing the latent heat towards a heat sink in thermal contact with the cold interface. The liquid then returns to the hot interface 602 through either capillary action of the wick structure 610, centrifugal force, or gravity action. The cycle repeats.

In one implementation, as depicted in FIG. 4, the hot interface 602 of the heat pipe assembly 466 is in thermal contact with at least one of the top plate 430 and the bottom plate 440, which are the surfaces to be cooled, and the cold interface 604 is in thermal contact with thermoelectric module 464 and the chill plate 420, which functions as a heat sink.

FIGS. 7A-7D depict schematic views of various surfaces 700a-700d of components that are subject to temperature control using the heat control devices according to one or more implementations of the present disclosure. Each surface 700a-700d is divided into a plurality of segments or pixels. Each segment is coupled with a heat control device, for example, heat control device 460, allowing for segmented temperature control of each temperature-control region of each surface 700a-700d.

The surfaces 700a-700d may be the surface of a gas distribution plate, an electrostatic chuck (e.g., the wafer support surface), or chamber wall. In one implementation, the surfaces 700a-700d represent various designs for the surface of a gas distribution faceplate, for example, the surface of gas distribution faceplate 450 as depicted in FIG.

4. In another implementation, the surfaces 700a-700d represent various designs for the wafer support surface of a chuck, for example, electrostatic chuck 242 as depicted in FIG. 2. In another implementation, the surfaces 700a-700d represent various designs for the surfaces of the chamber walls, for example, any of top wall 232, the sidewall 234, and the bottom wall 236 as depicted in FIG. 2.

Figure 7A:
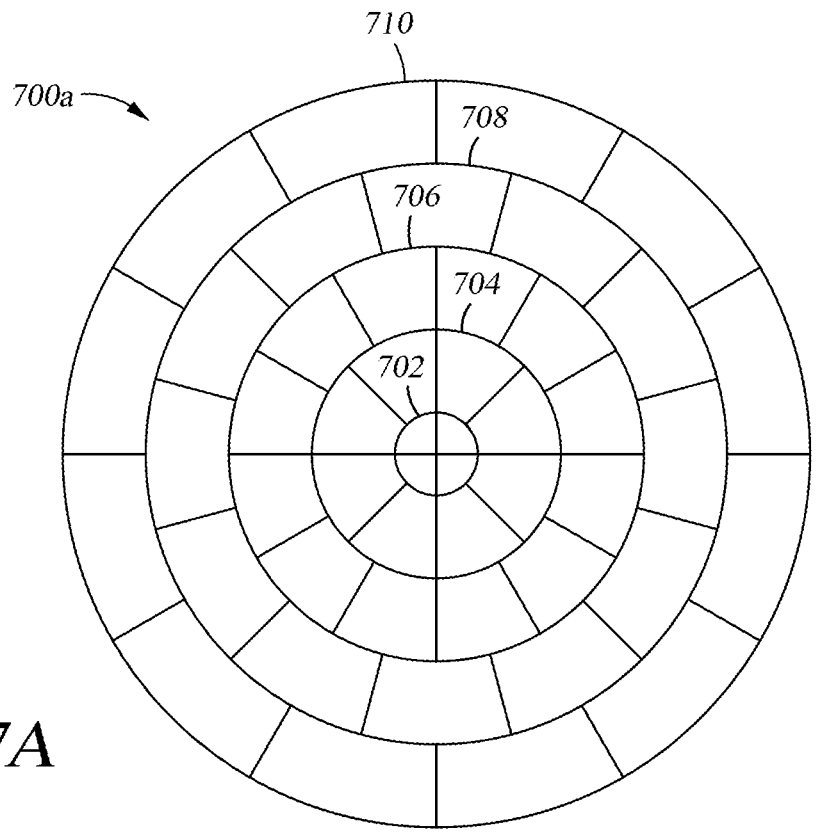
FIGS. 7A-7D depict schematic views of various chamber surfaces that may be used with a heat control device in accordance with one or more implementations of the present disclosure.

FIG. 7A depicts a schematic view of one implementation of a surface 700a that may be subject to temperature control using the heat control devices according to one or more implementations of the present disclosure. The surface 700a includes a plurality of concentric regions including a center region 702, a middle-inner region 704, a middle region 706, a middle-outer region 708, and an outer region 710. Each region is divided into a plurality of segments or pixels that are each subject to independent heat control using the heat control devices described herein. The surface 700a includes forty-eight segments.

Figure 7B:
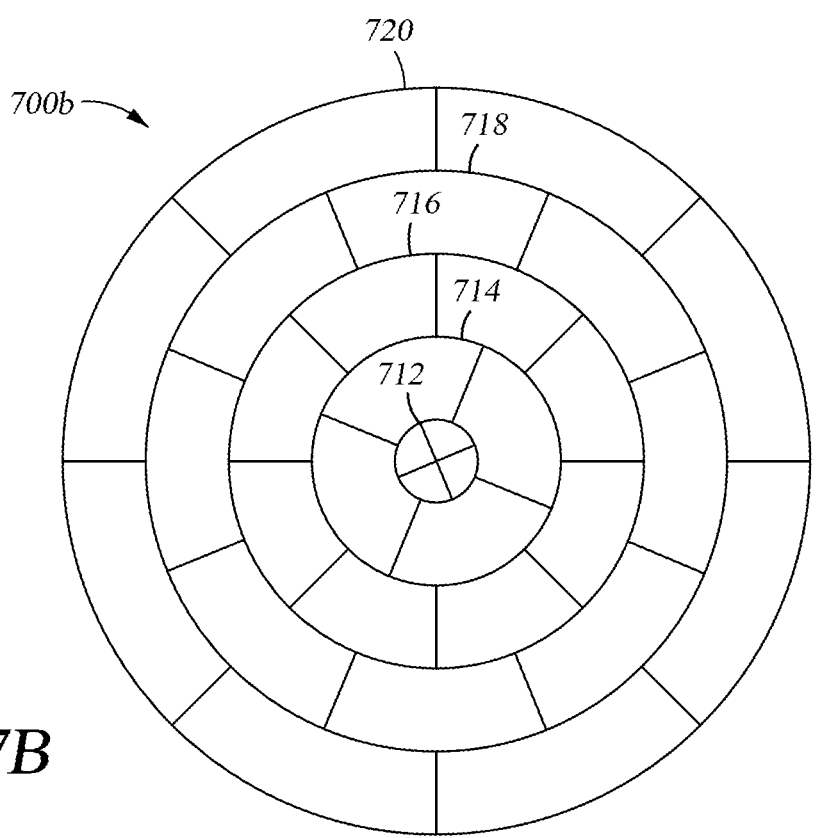

FIG. 7B depicts a schematic view of another implementation of a surface 700b that may be subject to temperature control using the heat control devices according to one or more implementations of the present disclosure. Similar to surface 700a, surface 700b includes a plurality of concentric regions. The surface 700a includes a plurality of concentric regions including a center region 712, a middle-inner region 714, a middle region 716, a middle-outer region 718, and an outer region 720. Each region is divided into a plurality of segments or pixels that are each subject to independent heat control using the heat control devices described herein. The surface 700a includes thirty-two segments.

Figure 7C:
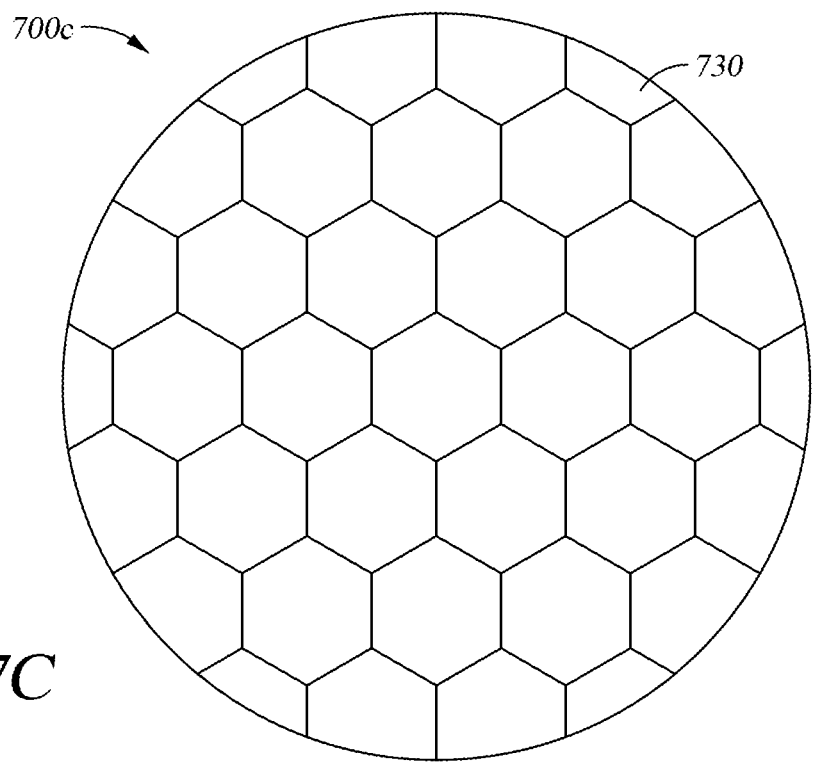

FIG. 7C depicts a schematic view of another implementation of a surface 700c that may be subject to temperature control using the heat control devices according to one or more implementations of the present disclosure. The surface 700c is divided into a plurality of pixels or hexagonal segment(s) 730. Each pixel or hexagonal segment 730 is subject to independent heat control using the heat control devices described herein.

Figure 7D:
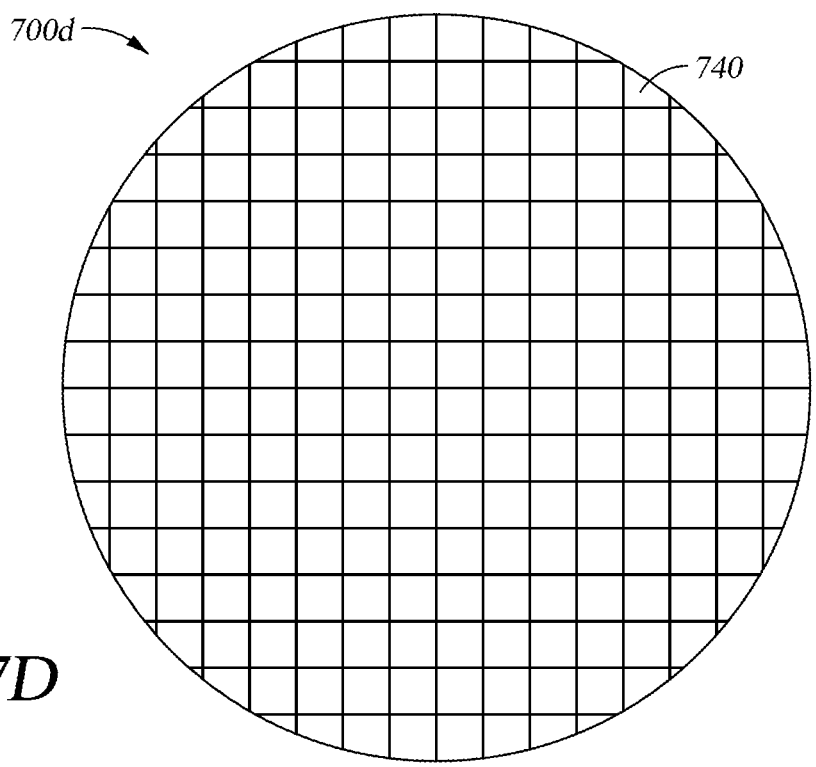

FIG. 7D depicts a schematic view of another implementation of a surface 700c that may be subject to temperature control using the heat control devices according to one or more implementations of the present disclosure. The surface 700d is divided into a plurality of segments or pixels 740 in an X-Y pattern. Each segment or pixel 740 is subject to independent heat control using the heat control devices described herein.

Figure 8:
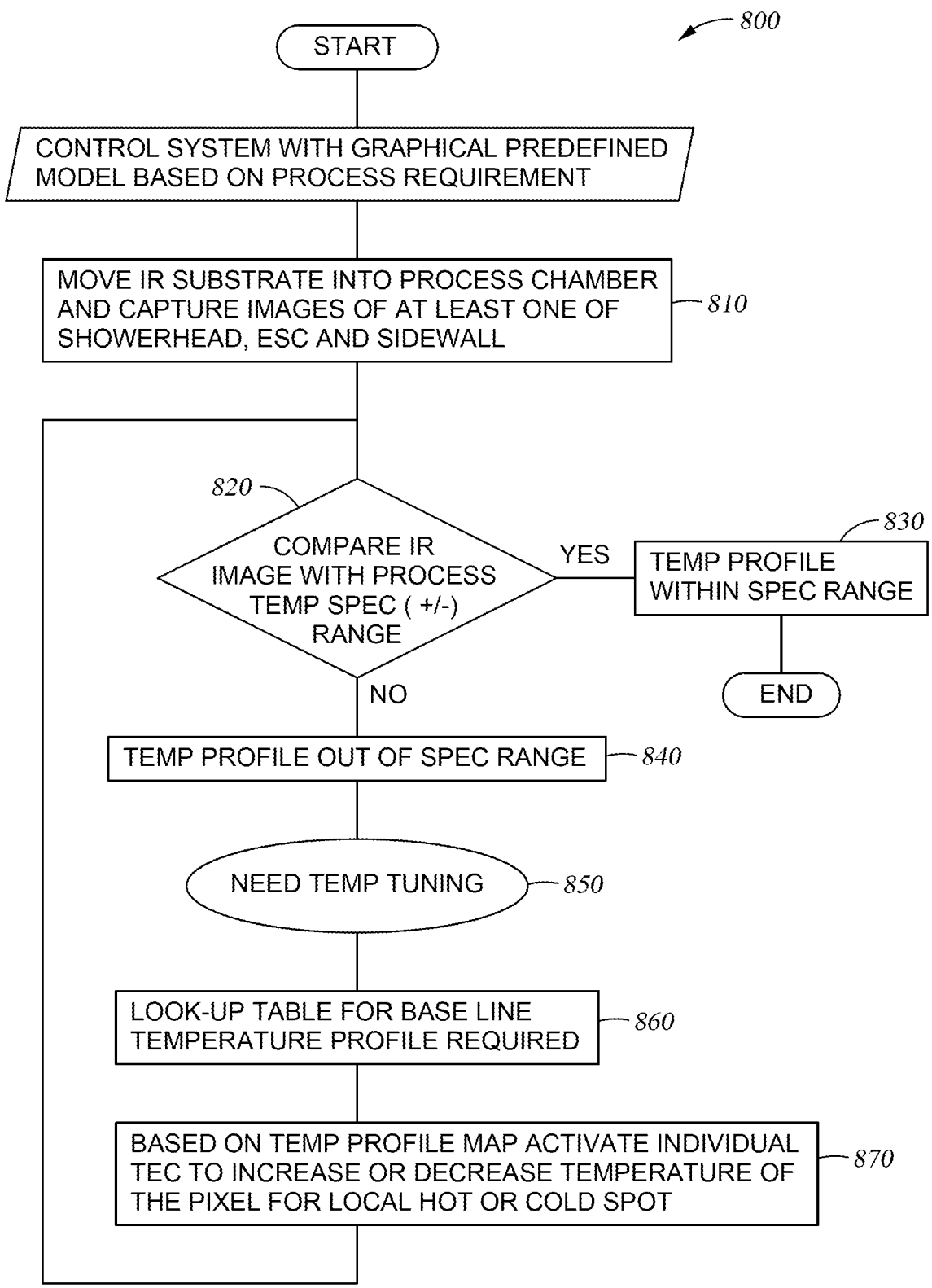
FIG. 8 is a process flow diagram of one implementation of a method for in-situ temperature control in accordance with one or more implementations of the present disclosure.

FIG. 8 is a process flow diagram of one implementation of a method 800 for in-situ temperature control in accordance with one or more implementations of the present disclosure. In some implementations, the method 800 is performed in a processing system, for example, processing system 100 depicted in FIG. 1. The method 800 can be performed in other systems that benefit from improved temperature control. The method 800 may be performed while processing a batch of wafers. For example, if running a batch of 500 wafers, the temperature-sensing disc can be substituted for a wafer after any number of wafers as chosen by the user.

At operation 810, a temperature-sensing disc is transferred into a processing chamber. In some implementations, the temperature-sensing disc is delivered into a processing region of the processing chamber without breaking vacuum. The temperature-sensing disc may be temperature-sensing disc 300 having cameras 310 configured to perform IR-based imaging of the surfaces within the processing chamber. The surfaces to be imaged include any surface where temperature control is desirable. The surfaces to be imaged typically include at least one of the surface of the showerhead assembly, the walls of the chamber (e.g., inner surfaces of the processing chamber including the sidewalls, bottom wall, and ceiling), and the exposed surfaces of the substrate support assembly (e.g., electrostatic chuck). In some implementations, a temperature of at least one region of at least one chamber surface in the processing region of the processing chamber is measured by imaging the at least one surface using the temperature-sensing disc. For example, referring to FIG. 2, the cameras 310 on the front surface 320 can image the surface of the showerhead assembly 260 and the sidewall 234 while the cameras 310 on the back surface 330 can image the surface of the electrostatic chuck 242 and the sidewall 234. The infrared images captured by the temperature-sensing disc may be wirelessly transferred to a control system, for example, control system 220.

At operation 820, the captured IR image of the imaged surface is analyzed to determine whether regions of the imaged surface are within a process temperature specification range. The captured IR image may be used to develop a measured temperature profile of the imaged surface. The measured temperature profile may be compared with the temperature specification range. The process temperature specification range may be established based on desirable temperature ranges for previously run processes that achieved desirable results. If the temperature profile indicates that all regions of the surface are within the desired temperature range, at operation 830, method 800 ends and substrate processing within the chamber continues.

If the measured temperature profile indicates that one or more regions of the surface are outside of the desired temperature range, at operation 840, method 800 proceeds to operation 850 and temperature tuning of the imaged surface is performed. If the measured temperature for a specific region is below the desired temperature range, the region is identified as a cold spot. If the measured temperature is above the desired temperature range for a specific region, the region is identified as a hot spot.

At operation 860, the measured temperature profile is compared to a baseline temperature profile, which is determined based on the desired processing temperatures. In some implementations, the baseline temperature profile is included in a lookup table or other algorithmic approach. The lookup table may be stored in the control system 220. The measured temperature profile is compared with the baseline temperature profile to develop a temperature profile map. The temperature control map identifies regions that have local cold spots and/or hot spots.

At operation 870, based on the temperature control map, individual thermoelectric modules may be activated to either increase or decrease the temperature for each region that has been identified as either a cold spot or a hot spot. For example, additional voltage may be applied to a thermoelectric module 464 to increase the pumping of heat. Depending on the location of hot or cold spots as indicated by the temperature map, the temperature of the electrode and chamber surfaces can be tuned (increased or decreased) at the pixel level to create a more uniform temperature profile.

After the temperature of the imaged surface is brought within the desired temperature specification, substrate processing may continue.

In summary, some of the benefits of the present disclosure include apparatus and methods for in-situ temperature measurement for the inside of a processing chamber without venting the processing chamber. Some of the implementations described herein provide the ability to measure and adjust temperature levels at the pixel level to create a more uniform temperature profile. This more uniform temperature profile reduces the presence of hot spots and cold spots on chamber surfaces, which subsequently reduces polymer adhesion on the cold spots, thus maintaining etch rates and reducing profile control issues. Further, some of the implementations described herein can be performed using currently available hardware and system architecture.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A showerhead assembly, comprising:
    a gas distribution plate having a plurality of through-holes operable to deliver process gases to a processing chamber and being divided into a plurality of temperature-control regions;
    a bottom plate coupled to the gas distribution plate and comprising a plurality of holes;
    bonding layer disposed between the bottom plate and the gas distribution plate;
    a plurality of heat control devices disposed above the bottom plate and operable to manage heat transfer independently in each of the plurality of the temperature-control regions, the plurality of the heat control devices comprising a plurality of thermoelectric modules configured to cool and heat the plurality of the temperature-control regions;
    a chill plate being a lid of the showerhead assembly and comprising a recess configured to contain containing the plurality of the heat control devices; and a plurality of heat pipes extending from the plurality of the thermoelectric modules into the plurality of the holes of the bottom plate, the plurality of thermoelectric modules comprising a first thermoelectric module being disposed between a first heat pipe and the chill plate, and the bonding layer being disposed between the first heat pipe and the gas distribution plate.

2. The showerhead assembly of claim 1, wherein:
    the plurality of thermoelectric modules are operable to control the heat transfer independently in each of the temperature-control regions of the gas distribution plate.

3. The showerhead assembly of claim 2, wherein the thermoelectric modules are arranged in concentric rings, each ring having at least one thermoelectric module that is operable to control the heat transfer independently from another thermoelectric module of an adjacent one of the concentric rings.

4. The showerhead assembly of claim 3, wherein the thermoelectric modules in each concentric ring are arranged in segments having at least one thermoelectric module that is operable to control the heat transfer independently from another thermoelectric module of an adjacent one of the segments.

5. The showerhead assembly of claim 3, wherein the thermoelectric modules in each concentric ring are arranged in segments, each segment associated with one of the thermoelectric modules, each thermoelectric module of each segment operable to control the heat transfer independently from other thermoelectric modules.

6. The showerhead assembly of claim 2, wherein each thermoelectric module is interfaced with at least one heat pipe.

7. The showerhead assembly of claim 2 wherein:
    the thermoelectric modules separating the chill plate from the bottom plate.

8. The showerhead assembly of claim 7, wherein the chill plate comprises a recessed portion, the recessed portion housing the thermoelectric modules.

9. The showerhead assembly of claim 7, wherein the chill plate is fabricated from aluminum oxide, aluminum nitride, or silicon carbide.

10. The showerhead assembly of claim 2, wherein the thermoelectric modules are arranged in an X/Y pattern of pixels, each pixel having at least one thermoelectric module that is operable to control the heat transfer independently from another thermoelectric module of an adjacent one of the pixels.

11. A showerhead assembly, comprising:
    a gas distribution plate having a plurality of through-holes operable to deliver process gases to a processing chamber and being divided into a plurality of temperature-control regions;
    a bottom plate coupled to the gas distribution plate and comprising a plurality of holes;
    a bonding layer disposed between the gas distribution plate and the bottom plate;
    a plurality of independently addressable thermoelectric modules disposed above the bottom plate and operable to manage heat transfer independently in each of the plurality of the temperature-control regions, the plurality of the thermoelectric modules being configured to cool and heat the temperature-control regions;
    a chill plate being a lid of the showerhead assembly and comprising a recess portion housing the plurality of the thermoelectric modules, the thermoelectric modules separating the chill plate from the gas distribution plate; and
    a plurality of heat pipes extending from the plurality of the thermoelectric modules into the plurality of the holes of the bottom plate, the plurality of thermoelectric modules comprising a first thermoelectric module being disposed between a first heat pipe and the chill plate, and the bonding layer being disposed between the first heat pipe and the gas distribution plate.

12. The showerhead assembly of claim 11, wherein the thermoelectric modules are arranged in concentric rings, each ring having at least one thermoelectric module that is operable to control the heat transfer independently from another thermoelectric module of an adjacent one of the rings.

13. The showerhead assembly of claim 12, wherein the thermoelectric modules in each concentric ring are arranged in segments having at least one thermoelectric module that is operable to control the heat transfer independently from another thermoelectric module of an adjacent one of the segments.

14. The showerhead assembly of claim 12, wherein the thermoelectric modules in each concentric ring are arranged in segments, each segment associated with one of the thermoelectric modules, each thermoelectric module of each segment operable to control the heat transfer independently from other thermoelectric modules.

15. The showerhead assembly of claim 12, wherein each thermoelectric module is interfaced with at least one heat pipe extending between the thermoelectric modules and the gas distribution plate.

16. The showerhead assembly of claim 11, wherein the thermoelectric modules are arranged in an X/Y pattern of pixels, each pixel having at least one thermoelectric module that is operable to control the heat transfer independently from another thermoelectric module of an adjacent one of the pixels.

17. The showerhead assembly of claim 16, wherein each thermoelectric module is interfaced with at least one heat pipe.

* * * * *